Figure 1:
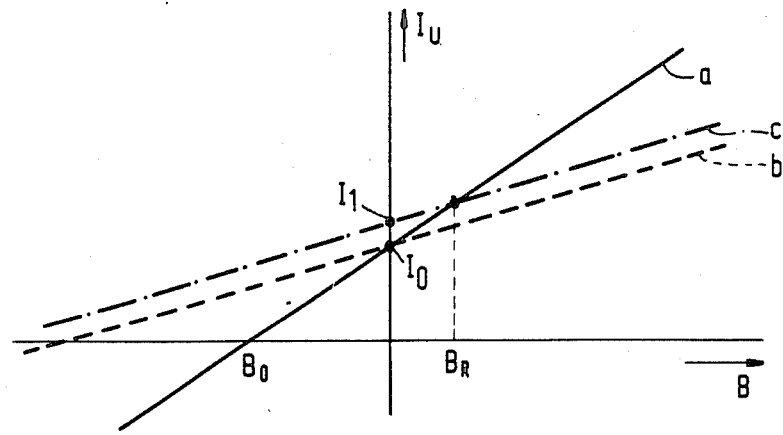

United States Patent [19]
Kordi et al.

[11] Patent Number: 4,694,248
[45] Date of Patent: Sep. 15, 1987

[54] MAGNETIC FIELD SENSOR COMPENSATED FOR OFFSET ERROR

[75] Inventors: Srdjan Kordi, Delft; Victor Zieren, Eindhoven; Simon Middelhoek, Rijswijk, all of Netherlands

[73] Assignee: U.S. Philips Corporation, New York, N.Y.

[21] Appl. No.: 574,773

[22] Filed: Jan. 27, 1984

[30] Foreign Application Priority Data

Feb. 15, 1983 [NL] Netherlands ............... 8300557

[51] Int. Cl.[4] ............. G01R 33/02; H03K 17/90; H03K 19/18
[52] U.S. Cl. ............................ 324/252; 307/309
[58] Field of Search ............... 324/252, 251, 244; 307/309; 357/5; 338/32 R, 32 H

[56] References Cited

U.S. PATENT DOCUMENTS 4,122,505 10/1978 Kuijk ..................... 324/252
4,296,447 10/1981 Lewis .................... 324/252

FOREIGN PATENT DOCUMENTS 0019827 12/1980 European Pat. Off. .
0065830 12/1982 European Pat. Off. ........ 324/252

Primary Examiner—Reinhard J. Eisenzopf
Assistant Examiner—Walter E. Snow
Attorney, Agent, or Firm—Robert T. Mayer; Bernard Franzblau

[57] ABSTRACT

A magnetic field sensor includes a magnetic field-sensitive element (1), more specifically a magnetic field-sensitive multi-collector transistor (2). To reduce the offset, the setting of this element is modulated to vary the sensitivity. In the variation of the output signal of the element (1) in response to the variation in the sensitivity the offset has then been reduced.

20 Claims, 4 Drawing Figures

MAGNETIC FIELD SENSOR COMPENSATED FOR OFFSET ERROR

This invention relates to a magnetic field sensor comprising a magnetic field-sensitive element having an output for supplying a signal which is a measure of a field detected by that element, and a setting circuit for setting the sensitivity of that element to the magnetic field.

Such a magnetic field sensor is, inter alia, disclosed in the article "Magnetic-Field-Sensitive Multicollector n.p.n. Transistors" by Victor Zieren and Bart P. M. Duyndam, published in "IEEE Transactions on Electron Devices," volume ED-29, No. 1, January 1982, pages 83–90.

A problem with such magnetic field sensors is that they exhibit an offset, which means that an output signal is produced in the absence of the field, and which also means that when the output signal has a zero value, a field having a certain value is actually present. When such sensors are used in motor commutation circuits they may cause commutation at incorrect instants so that the motor is energized asynchronously.

The invention has for an object to provide a magnetic field sensor of the type set forth in the opening paragraph, which has a reduced offset. The invention is characterized by a modulator for varying the setting of the magnetic-field sensitive element, and a detection circuit for detecting the variations in the signal at the output of the element as a function of the variation in the setting in order to produce an output signal in which the influence of the error component, which is formed because of the fact that a signal is present at the output in the absence of a magnetic field, is reduced.

When the setting is varied the output signal varies. When the offset is independent to a sufficient extent of the varying settings, the offset is present to a lesser extent in the variations of the output signal, so its influence is reduced.

A first embodiment of the invention may be characterized, as regards the detection circuit, in that the detection circuit is arranged to supply an output signal which is proportional to the difference between the signals at the output of the magnetic field-sensitive element at two different settings of that element.

The first embodiment may be further characterized, also as regards the detection circuit, in that the detection circuit is arranged to suppy an output signal which is indicative of the polarity of the difference between the signals at the output of the magnetic-field sensitive element at two different settings of that element. This makes the sensor particularly suitable for use in a motor commutator circuit.

This embodiment may further be characterized in that the values of the output signal of the magnetic-field sensitive element are determined by a sampling circuit at two different settings of that element.

A second embodiment of the invention may be characterized in that the variation of the output signal of the magnetic field-sensitive element due to a variation in the setting of that element is extracted by means of a filter circuit.

This embodiment may further be characterized in that an amplitude detector is included to determine the amplitude of said variation of the output signal, and also in that the amplitude detector is a synchronous detector.

As regards the modulator circuit of a magnetic field sensor according to the invention, in which the magnetic field-sensitive element is a magnetic field-sensitive transistor, it may be characterized in that the modulator varies the collector-base voltage of that transistor and/or in that the modulator varies the collector-substrate voltage of that transistor.

Figure 2:
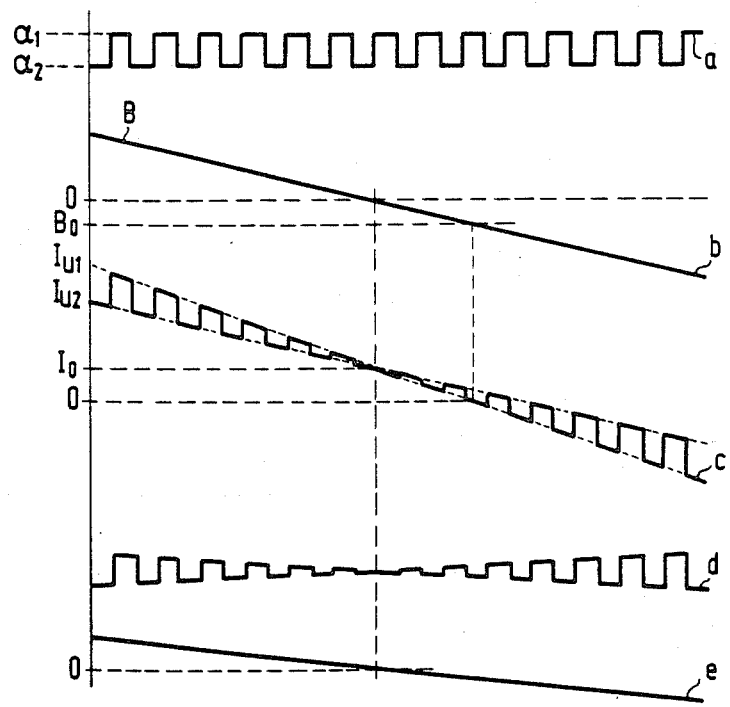
Figure 3:
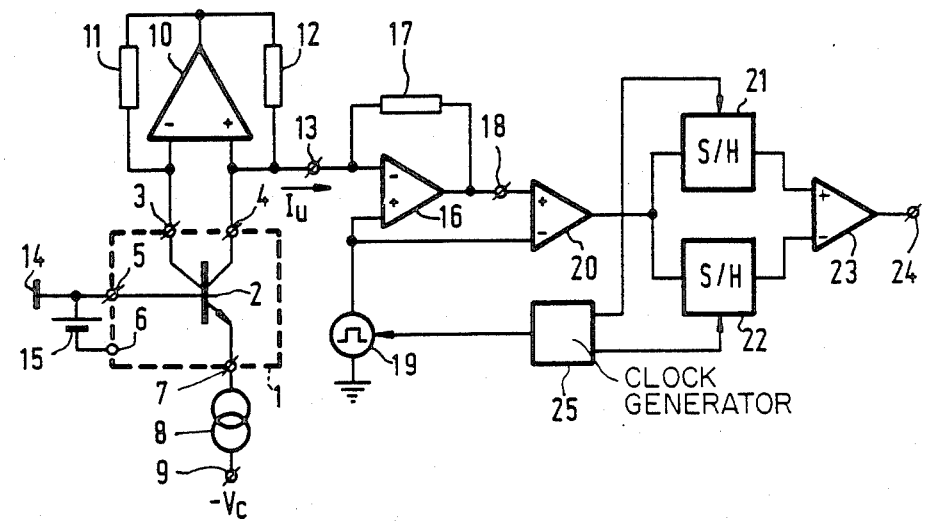
Figure 4:
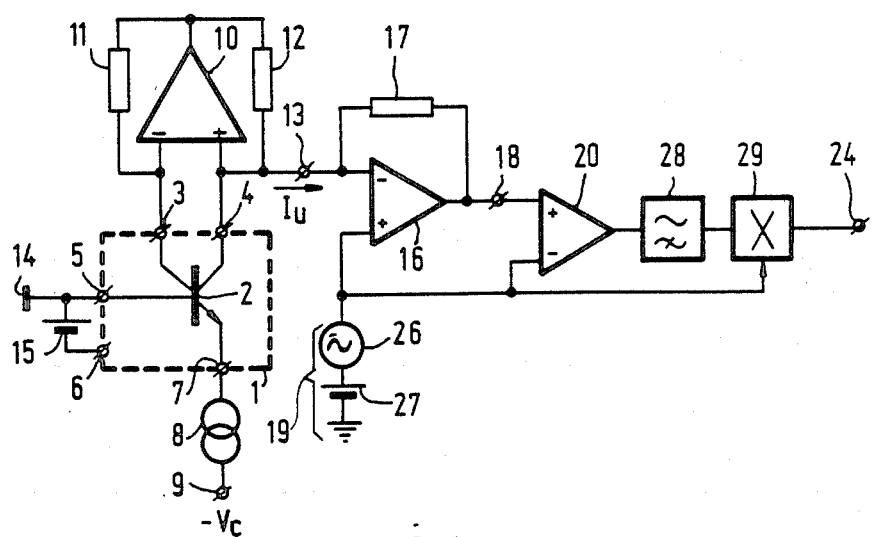

The invention will now be further described by way of example with reference to the accompanying drawings, in which:

FIG. 1 shows the output signal $I_u$ of a magnetic field-sensitive element as a function of the magnetic field B at a plurality of settings of this element, FIG. 2 shows some diagrams to explain the principle of the invention, FIG. 3 shows a first example of a magnetic field sensor according to the invention, and FIG. 4 shows a second example of a magnetic field sensor according to the invention.

FIG. 1 shows the output signal $I_u$ as a function of the magnetic field B at a number of settings of a magnetic field-sensitive element of a type with which the error compensation according to the invention can be used. Line a shows the variation of the output signal $I_u$ as a function of the magnetic field B when the element is set to a given sensitivity $\alpha_1$, the variation being shown as a straight line which is the ideal variation. This line intersects the $I_u=0$ axis at $B=B_o$, so $B_o$ is the field which has to be applied to obtain an output signal $I_u=0$, that is to say the magnetic error. For $B=0$, the output signal $I_u=I_o$. In this connection $I_o$ is then the error signal (electrical offset). Line a can be represented mathematically by the formula:

$$I_u = I_o + \alpha_1 B \tag{1}$$

When the element is set to a different, in this example a lower, a sensitivity $\alpha_2$ then, if the error signal is independent of that different setting, the line b is obtained which can be represented mathematically by the formula:

$$I_u = I_o + \alpha_2 B \tag{2}$$

If, according to the invention, the output signal $I_u$ is measured at two settings, then the error signal $I_o$ can be eliminated. If at a given field B an output signal $I_{u1}$ is obtained at setting $\alpha_1$ and an output signal $I_{u2}$ at setting $\alpha_2$, then it can be derived, using formulae (1) and (2), that:

$$B = \frac{1}{(\alpha_1 - \alpha_2)}(I_{u1} - I_{u2}) \tag{3}$$

If the field B is determined in accordance with expression (3), which is possible by obtaining, for example, the values $I_{u1}$ and $I_{u2}$ by sampling (FIG. 3) or, for example, by varying the setting at a certain frequency and extracting the a.c. component from the output signal by filtering (FIG. 4), then the influence of the error signal $I_o$ has been eliminated. Line b has been obtained by assuming the error signal $I_o$ to be independent of the setting $\alpha$. If this is not the case, then at a different setting $\alpha_2$ the line c is obtained which intersects line a at $B=B_R$ and evidences an error signal $I_1$. Line c can be represented mathematically by the formula:

$$I_u = I_1 + \alpha_2 B \tag{4}$$

As for $B=B_R$ the lines a and c intersect, this can be written as:

$$I_u = I_0 + (\alpha_1 - \alpha_2)B_R + \alpha_2 B \quad (5)$$

If, in accordance with the invention, an output signal $I_{u1}$ is obtened at a predetermined field B at a setting $\alpha_1$ and an output signal $I_{u2}$ at a setting $\alpha_2$ (line c), then it can be derived, using formulae (1) and (5), that:

$$B = \frac{1}{(\alpha_1 - \alpha_2)}(I_{u1} - I_{u2}) + B_R \quad (6)$$

Formula (6) shows that when the magnetic field-sensitive element has an electrical error signal which, in accordance with line c, depends on the setting, a magnetic error $B_R$ is obtained instead of the original magnetic error $B_o$ (line a). Thus an improvement is still possible if $|B_R| < |B_o|$ (both a positive and a negative $B_R$ and/or $B_o$ are possible). It should be noted that $B_R$ may depend on the sensitivity $\alpha$.

FIG. 2 shows some diagrams to explain the principle of the invention. Diagram a shows a varying sensitivity $\alpha$ which varies between the values $\alpha_1$ and $\alpha_2$. Diagram b shows a variation of the field B, which variation passes through the values $B=0$ and $B=B_o$. Diagram c shows the signal $I_u$ which varies between the values $I_{u1}$ and $I_{u2}$ in accordance with the formulae (1) and (3) and which for $B=0$ has the value $I_u = I_o$ and for $B=B_o$ has the value $I_u = 0$. For $B=0$ the amplitude of the modulation contained in the signal $I_u$ because of the variation between $\alpha_1$ and $\alpha_2$ has become equal to zero. If this modulation is extracted by filtering, then the signal shown in diagram d is obtained, which varies in a similar manner to the field B.

FIG. 3 shows a first example of an arrangement according to the invention. It comprises as a magnetic-field sensitive element 1 a magnetic field-sensitive transistor 2 having two collector contacts 3 and 4 between which the total collector current is distributed as a function of the magnetic field. The transistor 2 also has, an emitter contact 7, a base contact 5 and, possibly, a separate substrate contact 6. The emitter current is set by an emitter current source 8 included between the emitter contact 7 and a power supply terminal 9 which carries a voltage-Vc. In this example, the base voltage is fixed because the base contact is connected to ground 14. The base is biased relative to the substrate by a d.c. voltage source 15. The difference between the currents at collector contacts 3 and 4 is coupled to an output 13 by means of a current mirror formed by a differential amplifier whose inputs are connected to the collector contacts 3 and 4 and, via equal resistors 11 and 12, to the output of that differential amplifier. This type of current mirror has the advantage that the collector voltages at collector contacts 3 and 4 are kept equal. The output current appears at output 13. This output current is the signal $I_u$. Output 13 is connected to the inverting input of a differential amplifier 16, which input is connected to the output 18 of the differential amplifier via a resistor 17. This causes the signal current $I_u$ to be converted to a voltage at output 18. The non-inverting input of differential amplifier 16 receives a voltage from a source 19. As a result of the action of the amplifiers 16 and 10, this voltage is also present on the collector contacts 3 and 4, so that source 19 sets the collector voltage of the magnetic field-sensitive transistor 2.

The sensitivity of the transistor 2 can be varied by varying the collector-base voltage or by varying the collector-substrate voltage, for example by varying the voltage at the sources 15 or 19. In the examples the voltage from source 19 is varied. In FIG. 3 this is a pulse-shaped variation in accordance with FIG. 2, diagram a, as a result of which the voltage at output 18 is the voltage across resistor 17 superposed on the voltage from source 19. The voltage across resistor 17 can be taken off by a differential amplifier 20, at whose input a signal in accordance with FIG. 2, diagram c, then appears. In accordance with formula (3) the value of the field can be obtained therefrom by determining the difference between $I_{u1}$ and $I_{u2}$. In the embodiment shown in FIG. 3 this is effected by measuring the values of $I_{u1}$ and $I_{u2}$ with the aid of sampling circuits 21 and 22, and determining the difference by means of a differential amplifier 23. The sampling circuits 21 and 22 are operated with the aid of a clock generator 25 in synchronism with the voltage variations of source 19, so a signal in accordance with the diagram e of FIG. 2 appears at output 24 of differential amplifier 23. If, as is the case with a motor drive, only the polarity of the field B is of interest, then, for example, the differential amplifier can be arranged in such manner that it operates as a comparator so that output 24 signals merely the sign of the term $$\frac{1}{(\alpha_1 - \alpha_2)}(I_{u1} - I_{u2}).$$

It is alternately possible to use a filter to extract the modulation of the signal $I_u$ caused by the variation of $\alpha$ when that modulation is located in a frequency range in which the variations of the field B do not occur. A filter may then replace the sampling circuits 21 and 22. An example of this is shown in FIG. 4 where, by way of example, source 19 is modulated sinusoidally instead of in a pulse-shaped mode, because source 19 comprises an a.c. voltage in series with, optionally, a d.c. voltage source. A pass filter 28 which is tuned to the frequency of the a.c. voltage source 26, followed by a synchronous detector 29, is used in this embodiment instead of the sampling circuits 21 and 22. Synchronous detector 29 is controlled by the signal from source 26, causing a signal, shown in FIG. 2, diagram e and which is proportional to the field B, to appear at output 24. Possible constructions for embodiments of the invention are not limited to those shown. It is possible, for example, to use a different type of field-sensitive element and its output signal may be produced in a different manner.

What is claimed is:

1. A magnetic field sensor comprising, a magnetic field-sensitive element having an output for supplying a signal which is a measure of a magnetic field detected by said element, and a circuit for setting the sensitivity of said element to the magnetic field comprising, a modulator operatively coupled to said element for varying the sensitivity setting of the magnetic field-sensitive element between first and second different values so as to derive first and second different sensitivity curves, respectively, for said element, and a detection circuit coupled to said element for detecting a difference in signals at the output of the field-sensitive element as a function of the difference of said first and second sensitivity curves thereby to produce an output signal in which the influence of an offset error component in said signals is reduced, said error component being formed by a signal present at the output in the absence of a magnetic field.

2. A magnetic field sensor as claimed in claim 1, wherein the detection circuit includes means for supplying an output signal which is proportional to the difference between the signals at the output of the magnetic field-sensitive element at the first and second different setting values of said element.

3. A magnetic field sensor as claimed in claim 1, wherein the detection circuit includes means for supplying an output signal which is indicative of the polarity of the difference between the signals at the output of the magnetic-field sensitive element at the first and second different setting values of said element.

4. A magnetic field sensor as claimed in claim 2, wherein the detection circuit includes a sampling circuit for determining the values of the output signals of the magnetic field-sensitive element at the first and second different setting values of said element.

5. A magnetic field sensor as claimed in claim 1, wherein the detection circuit includes a filter circuit for deriving a signal indicative of the difference in the output signals of the magnetic field-sensitive element due to the variation in the sensitivity settings of said element.

6. A magnetic field sensor as claimed in claim 5, wherein the detection circuit includes an amplitude detector coupled to the filter circuit to determine the amplitude of said difference in the output signals.

7. A magnetic field sensor as claimed in claim 6, wherein the amplitude detector comprises a synchronous detector.

8. A magnetic field sensor as claimed in claim 1 wherein the magnetic field-sensitive element comprises a magnetic field-sensitive transistor, characterized in that the modulator varies the collector-base voltage of said transistor.

9. A magnetic field sensor as claimed in claim 1 wherein the magnetic field-sensitive element comprises a magnetic field-sensitive transistor having a collector and substrate, characterized in that modulator varies the collector-substrate voltage of said transistor.

10. A magnetic field sensor as claimed in claim 3 wherein the detection circuit includes a sampling circuit for determining the values of the output signals of the magnetic field-sensitive element at the the first and second different sensitivity values of said element.

11. A magnetic field sensor as claimed in claim 2 wherein the magnetic field-sensitive element comprises a magnetic field-sensitive transistor, characterized in that the modulator varies the collector-base voltage of said transistor.

12. A magnetic field sensor as claimed in claim 3 wherein the magnetic field-sensitive element comprises a magnetic field-sensitive transistor, characterized in that the modulator varies the collector-base voltage of said transistor.

13. A magnetic field sensor as claimed in claim 4 wherein the magnetic field-sensitive element comprises a magnetic field-sensitive transistor, characterized in that the modulator varies the collector-base voltage of said transistor.

14. A magnetic field sensor as claimed in claim 2 wherein the magnetic field-sensitive element comprises a magnetic field-sensitive transistor having a collector and substrate, characterized in that the modulator varies the collector-substrate voltage of said transistor.

15. A magnetic field sensor as claimed in claim 3 wherein the magnetic field-sensitive element comprises a magnetic field-sensitive transistor having a collector and substrate, characterized in that the modulator varies the collector-substrate voltage of said transistor.

16. A magnetic field sensor as claimed in claim 4 wherein the magnetic field-sensitive element comprises a magnetic field-sensitive transistor having a collector and substrate, characterized in that the modulator varies the collector-substrate voltage of said transistor.

17. A magnetic field sensor comprising: a magnetic field-sensitive element having an output for supplying a signal which indicates the level of a magnetic field detected by said element, a modulator electrically coupled to said element for electrically varying the sensitivity setting of the magnetic field-sensitive element between first and second different sensitivity values so that the element produces at its output, for a given level of a detected magnetic field, a first signal at the first sensitivity setting value and a second different signal at the second sensitivity setting value, said first and second signals each having an offset error signal component, and a detection circuit coupled to the output of said element for subtractively combining the first and second signals thereby to derive a further output signal in which said offset error signal components substantially cancel one another.

18. A magnetic field sensor as claimed in claim 17 wherein the modulator applies first and second electric bias signals of the same polarity to the magnetic field-sensitive element.

19. A magnetic field sensor as claimed in claim 17 wherein said element comprises a magnetic field-sensitive transistor having a fixed base-emitter bias voltage applied thereto.

20. A magnetic field sensor as claimed in claim 19 wherein said transistor comprises first and second collector contacts coupled to first and second terminals of a current mirror circuit, and said detection circuit includes a differential amplifier having a first input coupled to a terminal of the current mirror circuit and a second input coupled to a periodic voltage source operating as said modulator, said differential amplifier having a feedback circuit coupling an output thereof to said first input thereof.

* * * * *